US010833642B2

(12) United States Patent
Wani

(10) Patent No.: US 10,833,642 B2
(45) Date of Patent: Nov. 10, 2020

(54) AMPLIFIER FLICKER NOISE AND OFFSET MITIGATING SYSTEMS AND METHODS

(71) Applicant: SYNAPTICS INCORPORATED, San Jose, CA (US)

(72) Inventor: Barkat A. Wani, San Jose, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/164,717

(22) Filed: Oct. 18, 2018

(65) Prior Publication Data

US 2019/0123701 A1    Apr. 25, 2019

Related U.S. Application Data

(60) Provisional application No. 62/575,344, filed on Oct. 20, 2017.

(51) Int. Cl.
*H03F 1/02* (2006.01)
*H03F 3/45* (2006.01)
*H03F 3/393* (2006.01)

(52) U.S. Cl.
CPC ....... *H03F 3/45475* (2013.01); *H03F 1/0222* (2013.01); *H03F 3/393* (2013.01);
(Continued)

(58) Field of Classification Search
CPC .. H03F 3/45475; H03F 3/45968; H03F 3/393; H03F 1/0222; H03F 2203/45048;
(Continued)

(56) References Cited

U.S. PATENT DOCUMENTS 7,492,149 B2 * 2/2009 Motz ................ G01D 5/147
324/207.12
9,614,481 B2 * 4/2017 Ivanov ................ H03F 1/26
(Continued)

FOREIGN PATENT DOCUMENTS

JP    2003-198404    7/2003
JP    2010-141406    6/2010

OTHER PUBLICATIONS

J. Witte et al., A Current-Feedback Instrumentation Amplifier with 5μV Offset for Bidirectional High-Side Current-Sensing, IEEE Journal of Solid-State Circuits, Dec. 2008, pp. 2769-2775, vol. 43, No. 12.

(Continued)

*Primary Examiner* — Khanh V Nguyen
(74) *Attorney, Agent, or Firm* — Haynes and Boone, LLP

(57) ABSTRACT

A system includes an amplification circuit and offset calibration circuit. The amplification circuit includes a modulation circuit operable to modulate a received signal, an amplifier operable to amplify the modulated signal, and a modulation circuit operable to demodulate the amplified signal. The offset calibration circuit includes a logic circuit operable to set a control signal and adjust the control signal based on an output of the amplification circuit, where the output is based on the demodulated signal, and a compensation signal generator operable to generate a compensation signal based on the control signal to compensate for an offset associated with the amplification circuit, and apply the compensation signal on the amplification circuit to adjust the output of the amplification circuit. The offset calibration circuit in conjunction with the application circuit reduces flicker, offset, and offset drift, and also suppresses the upmodulate ripple due to chopping.

19 Claims, 9 Drawing Sheets

(52) U.S. Cl.
CPC ... *H03F 3/45968* (2013.01); *H03F 2200/321* (2013.01); *H03F 2200/375* (2013.01); *H03F 2203/45048* (2013.01)

(58) Field of Classification Search
CPC ......... H03F 2200/375; H03F 2200/321; H03F 1/303; H03F 3/005
USPC ............................................................ 330/9
See application file for complete search history.

(56) References Cited

U.S. PATENT DOCUMENTS

| | | | |
|---|---|---|---|
| 2002/0160738 A1 | 10/2002 | Allott et al. | |
| 2005/0079843 A1 | 4/2005 | Gorday et al. | |
| 2009/0302923 A1* | 12/2009 | Smeloy | H03F 3/45623 327/307 |
| 2011/0001560 A1* | 1/2011 | Eschauzier | H03F 3/45753 330/253 |
| 2016/0336985 A1 | 11/2016 | Temkine et al. | |

OTHER PUBLICATIONS

R. Burt et al., A Micropower Chopper-Stabilized Operational Amplifier Using a SC Notch Filter with Synchronous Integration Inside the Continuous-Time Signal Path, IEEE Journal of Solid-State Circuits, Dec. 2006, pp. 2729-2736, vol. 41, No. 12.

Rong Wu et al., A Chopper Current-Feedback Instrumentation Amplifier with a 1 mHz 1/f Noise Corner and an AC-Coupled Ripple Reduction Loop, IEEE Journal of Solid-State Circuits, Dec. 2009, pp. 3232-3243, vol. 44, No. 12.

Yoshinori Kusuda, Auto Correction Feedback for Ripple Suppression in a Chopper Amplifier, IEEE Journal of Solid-State Circuits, Aug. 2010, pp. 1436-1445, vol. 45, No. 8.

Christian Menolfi et al., A Fully Integrated, Untrimmed CMOS Instrumentation Amplifier with Submicrovolt Offset, IEEE Journal of Solid-State Circuits, Mar. 1999, pp. 415-420, vol. 34, No. 3.

* cited by examiner

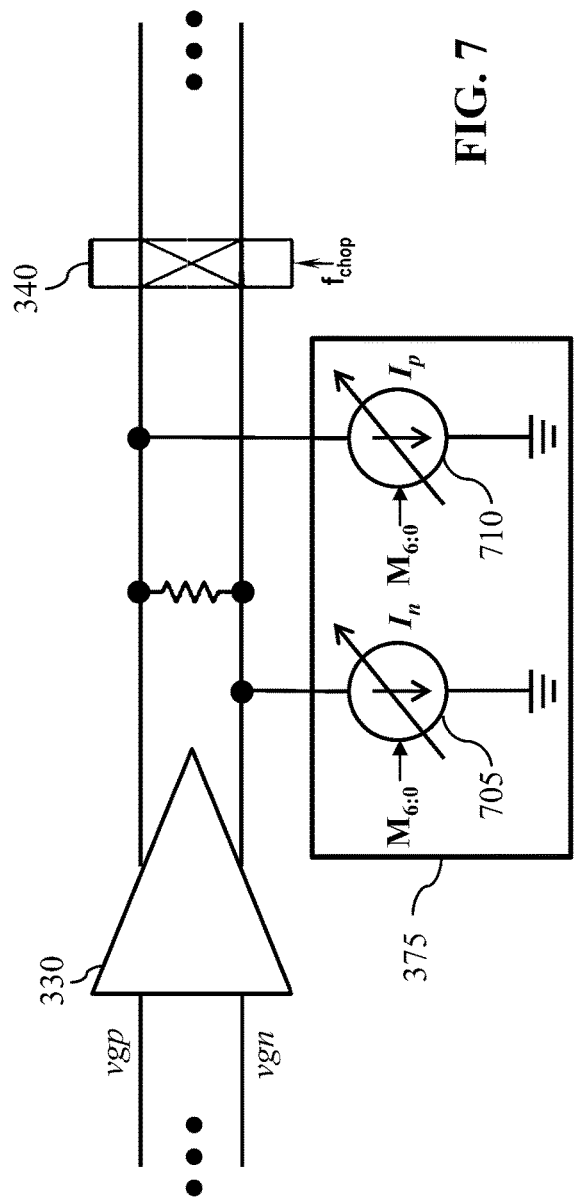
FIG. 7
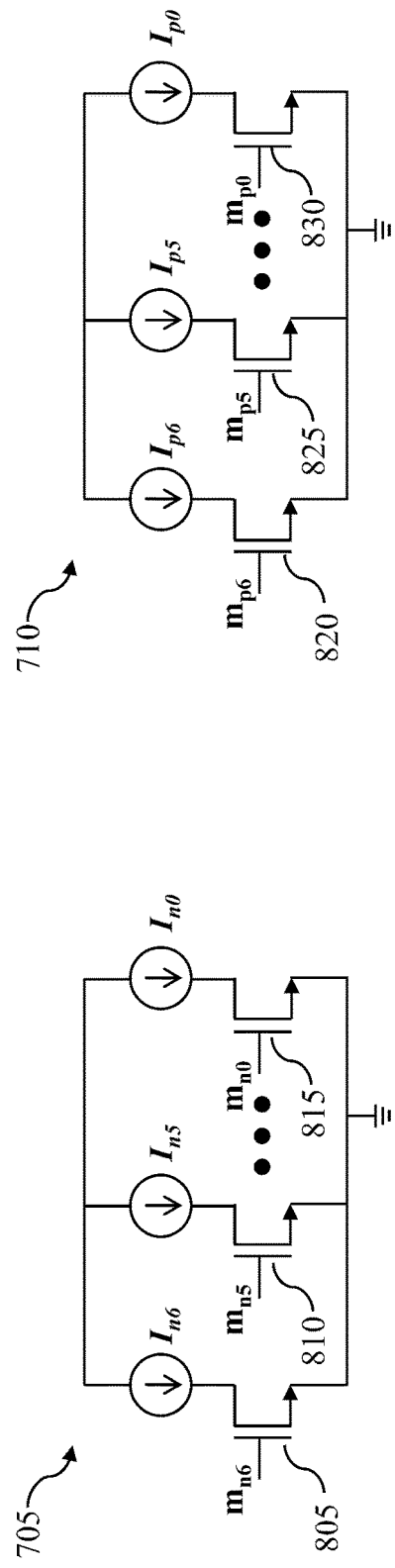
FIG. 8B
FIG. 8A

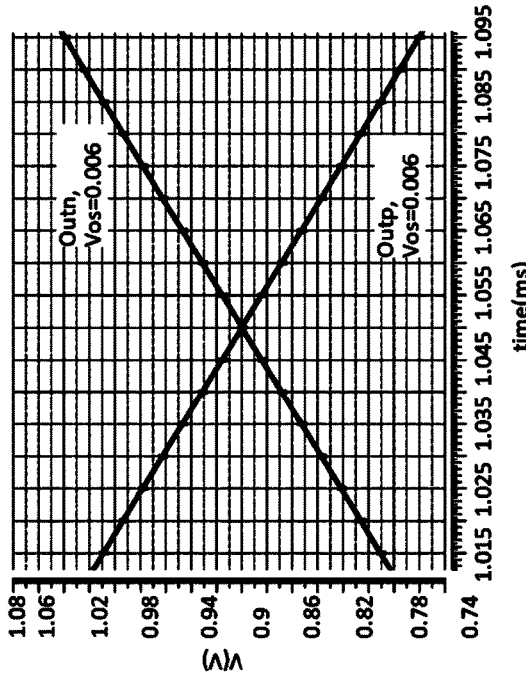
FIG. 10A
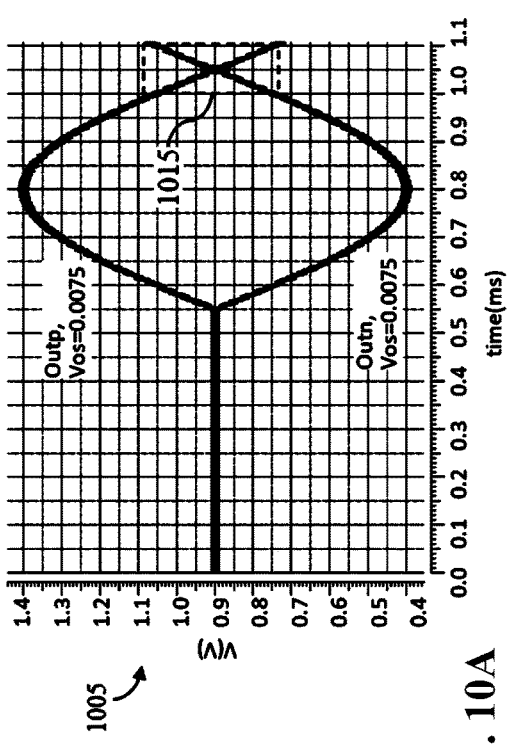
FIG. 10B
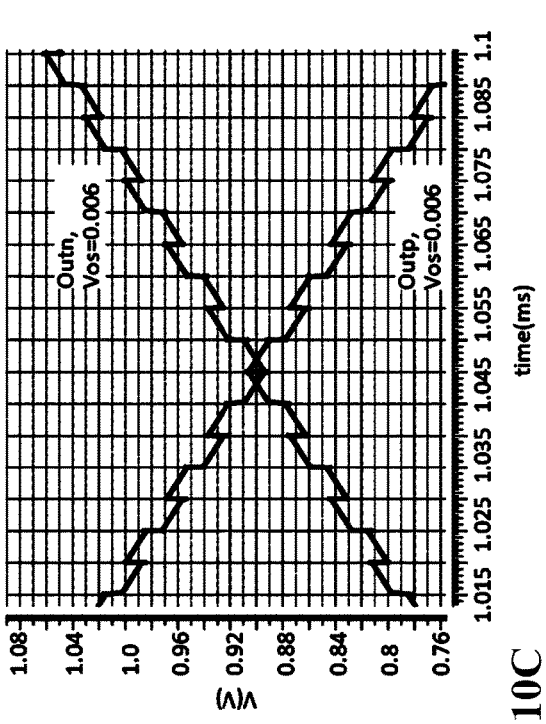
FIG. 10C
FIG. 10D

US 10,833,642 B2

AMPLIFIER FLICKER NOISE AND OFFSET MITIGATING SYSTEMS AND METHODS

CROSS-REFERENCE TO RELATED APPLICATIONS

The present application claims the benefit of and priority to U.S. Provisional Patent Application No. 62/575,344, filed Oct. 20, 2017, which is hereby incorporated by reference in its entirety.

TECHNICAL FIELD

The present application, in accordance with one or more embodiments, relates generally to audio processing and, more particularly, for example, to mitigation of amplifier noise, offset, and ripple in audio systems.

BACKGROUND

Analog signal processing systems typically include amplifiers to amplify audio signals. In a transmit path, amplified audio signals may be provided to one or more output audio devices, such as a headset or speakers, for playback. In a receive path, amplified audio signals may be digitized for processing and/or storage. However, the analog signal processing systems are known to add noise and offset to a signal as the signal passes through analog circuitry such as amplifiers in the transmit and receive paths, thereby degrading signal quality. Thus, there is a continued need in the art for improved signal processing solutions that mitigate noise and offset.

SUMMARY

In accordance with various embodiments further discussed herein, methods and systems for mitigating amplifier flicker noise and offset are provided. Such methods and systems may utilize modulation and demodulation circuits to separate (e.g., in frequency) a signal from the flicker noise and offset that impair the signal, and a calibration circuit to compensate for amplifier offset and thereby suppress a ripple associated with an upmodulated offset.

In one or more embodiments, a system includes an amplification circuit and an offset calibration circuit. The amplification circuit includes a first modulation circuit configured to modulate a received signal to obtain a modulated signal. The amplification circuit further includes an amplifier configured to amplify the modulated signal to obtain an amplified signal. The amplification circuit further includes a second modulation circuit configured to demodulate the amplified signal to obtain a demodulated signal. The offset calibration circuit includes a logic circuit configured to set a control signal and adjust the control signal based on an output of the amplification circuit, where the output is based on the demodulated signal. The offset calibration circuit further includes a compensation signal generator configured to generate one or more compensation signals based on the control signal to compensate for an offset associated with the amplification circuit. The compensation signal generator is further configured to apply the one or more compensation signals on the amplification circuit to adjust the output of the amplification circuit.

In one or more embodiments, a method includes modulating, by a first modulation circuit of an amplification circuit, an input signal to obtain a modulated signal, and amplifying, by a first stage of the amplification circuit, the modulated signal to obtain an amplified signal. The method further includes setting, by a logic circuit, a control signal, and generating, by a compensation signal generator, one or more compensation signals based on the control signal to compensate for an offset associated with the amplification circuit. The method further includes applying, by the compensation signal generator, the one or more compensation signals on the amplification circuit to adjust the output of the amplification circuit, where the output is based on the demodulated signal.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

FIG. 7 illustrates an example of a compensation signal generator and associated connections to an amplification circuit in accordance with one or more embodiments of the present disclosure.

FIGS. 8A and 8B illustrate examples of current generators of a compensation signal generator.

FIGS. 10A-10D illustrate graphs of differential output voltages of a chopped amplification circuit over time, with and without offset mitigation.

DETAILED DESCRIPTION

Figure 1:
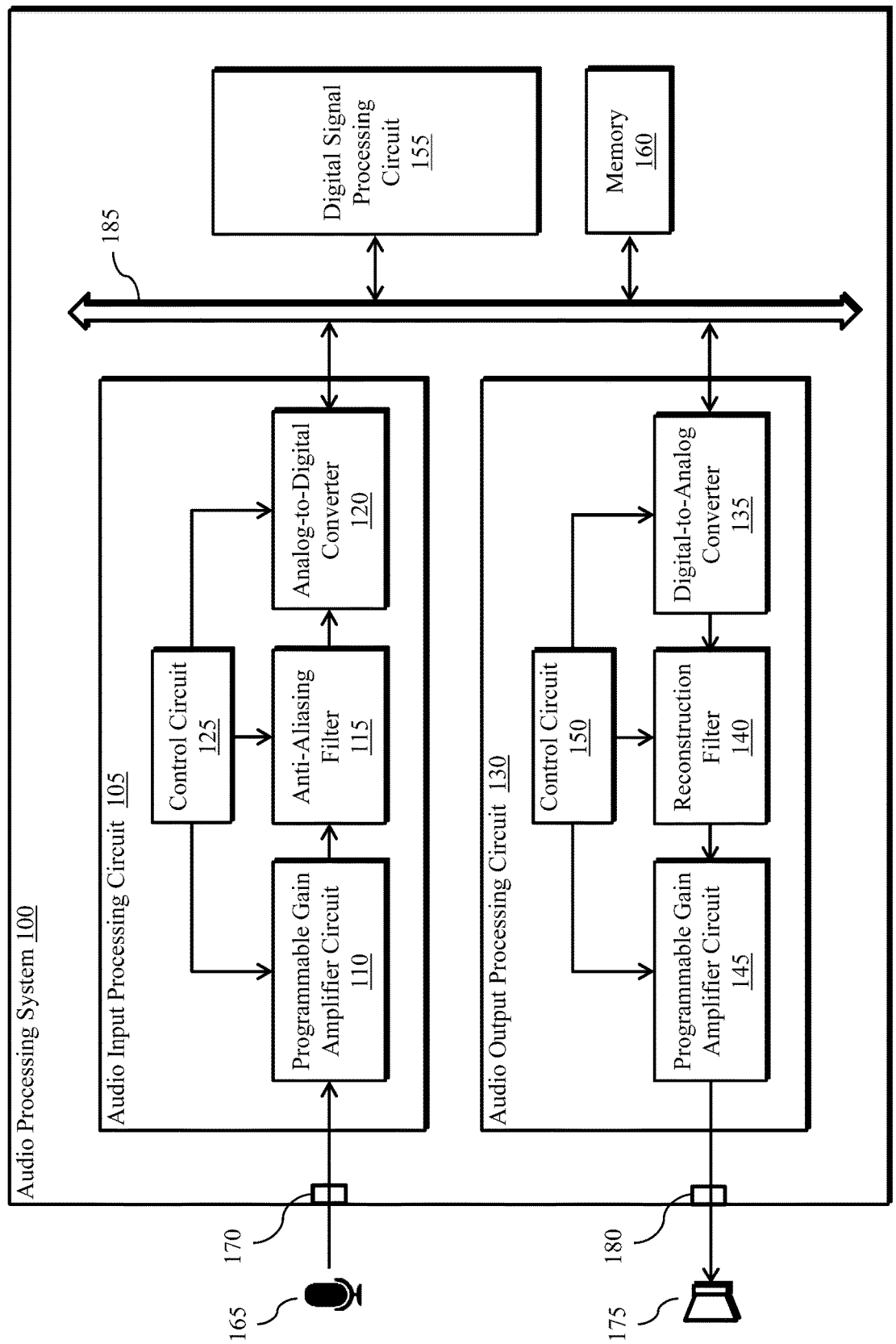
FIG. 1 illustrates an audio processing system for processing audio signals, including implementing flicker noise and offset mitigation, in accordance with one or more embodiments of the present disclosure.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims.

Various techniques are provided herein to facilitate mitigation of amplifier noise, offset, and offset drift in audio systems and applications. Noise, offset, and offset drift may degrade performance of the audio systems. Such degradation of performance may be evaluated using metrics that are objective in nature and quantifiable, such as signal-to-noise ratio of audio signals, and/or using metrics that are subjective, such as audio quality as perceived by a user (e.g., consumer) of the audio signals. The noise, offset, and offset drift may be contributed (e.g., presented, added) to signals (e.g., audio signals) by amplifiers of the audio systems. The noise may include flicker noise (e.g., also referred to as 1/f noise), which is more prevalent at lower frequencies, and thermal noise, which is generally relatively constant across frequencies. The flicker noise may be characterized by a 1/f corner, in which noise is dominated by the flicker noise at frequencies lower than the 1/f corner and dominated by the thermal noise at frequencies higher than the 1/f corner. For example, the 1/f corner may be in the tens of kilohertz.

In some cases, transistors used to implement the amplifiers may contribute flicker noise, thermal noise, offset, and offset drift. An example transistor may be a complementary metal-oxide-semiconductor (CMOS) transistor, although other types of transistors may present flicker noise, offset, and offset drift. Flicker noise, offset, and offset drift are generally inversely related to device size (e.g., width and length of transistors). Therefore, a common approach to decrease impairments due to flicker noise, offset, and offset drift is to increase the device (e.g., transistor) size. However, increasing device size to overcome these impairments consumes chip real estate and adds chip costs in manufacturing chips that utilize these amplifiers.

The offset may be due to mismatches between transistors of the amplifiers. For a given amplifier, the offset may cause a non-zero signal (e.g., non-zero current, non-zero voltage) at the output of the amplifier even when no signal is provided to the amplifier. As an example, for a differential input of zero volts to an amplifier, a difference of differential outputs of the amplifier may be non-zero. The offset is generally undesirable as it can saturate components of an audio system, such as an analog-to-digital converter (ADC) that is taking the output of the amplifier as its input. If the amplifier is driving a speaker or a headphone, the offset may be perceived as an undesirable, audible pop.

A modulation/demodulation technique, such as chopping, may be utilized to overcome the flicker noise and offset impairments, but the associated upmodulated offset and flicker noise from applying modulation to the offset and flicker noise give rise to a ripple in the output of the amplifier. For example, when the modulation involves chopping, the ripple may be referred to as a chopping ripple or a chopping artifact. When an audio signal is played back to a user, the ripple in the audio signal may cause sound degradation that is perceptible to the user. When an audio signal is to be stored, digitizing the audio signal that contains ripple may cause a reduction in resolution of the audio signal and an associated reduction in audio quality. The ripple, or its effects, may be audible during playback of the stored audio signal. The offset drift is a change in the offset over time and may be temperature dependent.

In some embodiments, an audio system may include an amplification circuit with a modulation-demodulation circuit pair and an amplifier between the modulation-demodulation circuit pair. The modulation circuit may modulate an audio signal, the amplifier may amplify the modulated audio signal and add impairments (e.g., noise, offset), and the demodulation circuit may demodulate the amplified modulated audio signal but modulate the impairments. In various embodiments, the modulation and demodulation circuits may be chopper circuits.

To mitigate the flicker noise, the modulation and demodulation may be utilized to separate the audio signal from the impairments. The modulation circuit may modulate the audio signal by upconverting the audio signal to a higher frequency range. When passed through the amplifier, the amplified modulated audio signal is at the higher frequency range while the flicker noise, offset, and offset drift are added by the amplifier at lower frequencies. The demodulation circuit may modulate an output from the amplifier by downconverting the amplified modulated audio signal to baseband (e.g., frequency range of the audio signal provided to the modulation circuit) and upconverting the impairments.

With the flicker noise and offset being modulated to a frequency range different from (e.g., higher than) the amplified audio signal at baseband, the flicker noise and offset are separated from the amplified audio signal and, in some cases, can be mitigated to some extent by the roll-off of the frequency response of the amplifier. However, a residual high frequency effect due to the upmodulated flicker noise and offset remains, and this residual effect shows up as a ripple in the amplifier output. Although the offset after modulation may cause noticeable degradation in audio quality, the flicker noise after modulation generally does not noticeably degrade audio quality. In some cases, additional filtering may be provided to reduce or eliminate the ripple at the higher frequencies to further mitigate its effect. For example, the filtering may be provided by one or more amplification stages after the amplifier and/or by active filtering after the amplifier.

To mitigate the offset and the effects of the offset, the audio system may include a calibration circuit. The calibration circuit may include a logic circuit and a compensation signal generator. The logic circuit may generate a control signal based on an output of the amplification circuit and provide the control signal to the compensation signal generator. The output of the amplification circuit may be, or may be based at least in part on, an output of the demodulation circuit. The compensation signal generator may generate one or more compensation signals based on the control signal and apply the compensation signal(s) on the amplification circuit. The application of the compensation signal(s) may cause an adjustment to the output of the amplification circuit. A compensation signal may include an electrical signal, such as a current or voltage signal, applied by the compensation signal generator at an output of the amplifier. In some cases, the offset may be reduced to tens of microvolts, or even lower per specification.

In one embodiment, the logic circuit and compensation signal generator operate iteratively such that the compensation signal(s) converges to signal(s) that effectively compensate for (e.g., cancel out, null out, eliminate, mitigate) the offset associated with the amplification circuit. With the offset compensation, the ripple due to the upmodulated offset is not present or is negligible at the output. For example, one of a pair of compensation signals may be provided to each differential output of the amplifier to cancel out the contribution of the offset on the output of the amplification circuit. When the compensation signals are current signals, such compensation signals may be referred to as nulling currents. The offset drift may be mitigated by adjusting the compensation signal(s) in response to changes in the offset over time. In some cases, the offset drift may cause the offset to drift on the order of a few microvolts/° C.

In one embodiment, the compensation signal(s) to be provided to the amplification circuit to mitigate offset may be determined during a calibration phase. After the calibration phase, the compensation signal(s) used to mitigate the offset may remain fixed. A subsequent calibration phase may be performed periodically and/or when the offset has drifted sufficiently to cause a noticeable (e.g., audible) clipping or distortion to be present at an output of the amplification circuit.

Thus, using various embodiments disclosed herein, amplifier noise, offset, and offset drift in audio systems may be mitigated. In some aspects, the mitigation of such impairments may be achieved while providing silicon area savings and meeting noise specifications. For example, the mitigation may be achieved while maintaining device sizes relative to a case in which device sizes are increased to decrease flicker noise, offset, and offset drift. Smaller device sizes may be associated with lower parasitics, allowing use of smaller transconductance to get a same bandwidth relative to a case with higher parasitics. In this manner, current savings may be achieved as well. In this implementation, the modulation and demodulation is a continuous time technique and no sampling is involved. Since sampling is not utilized with respect to amplifier noise, offset, and offset drift mitigation, thermal noise folding is avoided.

In some cases, the modulation-demodulation circuit pair and the calibration circuit in accordance with embodiments of the present disclosure can be implemented together with other techniques. Such other techniques may include, for example, reducing noise, offset, and offset drift by increasing device size (e.g., to a lesser degree than if device size adjustment were the primary means for reducing the impairments), performing filtering, and/or improving element matching. For example, such filtering, if used, may be performed with lower-order filters, relative to a case in which higher-order filters (which are generally large and complex) are used to remove the flicker noise, offset, and/or offset drift.

In various embodiments, amplifier noise, offset, and offset mitigation can be implemented for amplifiers in a transmit path and/or a receive path. A transmit path (e.g., also referred to as a playback path) may refer to a path for providing the processed audio signals to audio output devices, such as a headset or speakers, to allow playback of the processed audio signals. A receive path (e.g., also referred to as a record path) may refer to a path for receiving of audio signals by an audio input device, such as a microphone. In the transmit path, amplification may be performed to increase signal power of audio signals provided to the audio output devices. In the receive path, amplification may be performed to increase signal power of audio signals received by the audio input devices. By way of non-limiting example, amplifiers may be utilized to implement current steering amplifiers, headphone amplifiers, line out amplifiers, microphone amplifiers, line in amplifiers, and/or other amplifiers.

Turning now to the figures, FIG. 1 illustrates an audio processing system 100 for processing audio signals, including implementing noise, offset, and offset drift mitigation, in accordance with one or more embodiments of the present disclosure. Not all of the depicted components may be required, however, and one or more embodiments may include additional components not shown in the figure. Variations in the arrangement and type of the components may be made without departing from the scope of the claims as set forth herein, including additional components, different components, and/or fewer components.

The audio processing system 100 includes an audio input processing circuit 105, an audio output processing circuit 130, a digital signal processing circuit 155, a memory 160, and a bus 185. The audio processing system 100 includes an audio input port 170 (e.g., a mic in or a line in port) for connecting to an audio input device 165, such as a microphone, and an audio output port 180 (e.g., a headphone out or a line out port) for connecting to an audio output device 175, such as a speaker or a headset. For example, the audio input port 170 and/or audio output port 180 may be a jack or socket through which a wired connection may be made. In some cases, the audio input device 165 and/or audio output device 175 may be connected wirelessly to the audio processing system 100 alternatively and/or in addition to the wired connection.

The audio input processing circuit 105 includes various components to process (e.g., amplify, filter, perform transforms, convert between digital and analog domains) audio signals provided to the audio input processing circuit 105 via the input device 165. In FIG. 1, the audio input processing circuit 105 includes a programmable gain amplifier circuit 110, an anti-aliasing filter 115, an ADC 120, and a control circuit 125. The control circuit 125 may provide control signals to configure the programmable gain amplifier circuit 110, anti-aliasing filter 115, and/or ADC 120. For example, the control circuit 125 may generate and/or retrieve (e.g., from memory such as the memory 160) filter parameters and quantization parameters and provide them to the anti-aliasing filter 115 and ADC 120, respectively.

Similarly, the audio output processing circuit 130 includes various components to process audio signals and provide processed audio signals to the audio output device 175 (e.g., for the audio output device 175 to play the audio signals to a user). In FIG. 1, the audio output processing circuit 130 includes a digital-to-analog converter (DAC) 135, reconstruction filter 140, programmable gain amplifier circuit 145, and control circuit 150. The control circuit 150 may provide control signals to configure the DAC 135, reconstruction filter 140, and programmable gain amplifier circuit 145.

The digital signal processing circuit 155 may process (e.g., filter, edit, perform equalization on) digital signals, such as digitized audio signals received from the ADC 120 of the audio input processing circuit 105 and/or digitized audio signals to be provided to the DAC 135 of the audio output processing circuit 130 and/or the memory 160. The memory 160 may store audio signals and associated metadata (e.g., timestamp, audio bitrate), information associated with processing audio signals (e.g., filter coefficients, etc.), and/or other information. In one embodiment, the memory 160 may store information indicative of offset compensation parameters and modulation parameters for facilitating mitigation of flicker noise, offset, and offset drift. The bus 185 may be utilized to facilitate communication of data between the audio input processing circuit 105, audio output processing circuit 130, digital signal processing circuit 155, and memory 160.

In FIG. 1, a receive path may refer to a path from the audio input device 165 (e.g., a microphone to receive audio signals) through the audio input processing circuit 105 for processing. A transmit path may refer to a path through the audio output processing circuit 130 to the audio output device 175 to allow playback of audio signals.

In the receive path, when an audio signal is provided to the input device 165 (e.g., a microphone), such as when a user speaks into the input device 165, the audio signal may be processed by (e.g., amplified, filtered, and/or other processing by) the programmable gain amplifier circuit 110, anti-aliasing filter 115, and ADC 120. The ADC 120 digitizes the audio signal that is output from the anti-aliasing filter 115 such that the digitized audio signal may be processed digitally, such as by the digital signal processing circuit 155, and/or provided for storage (e.g., to be played back at a later time), such as in the memory 160.

In the transmit path, a digital-domain audio signal may be retrieved from storage, such as from the memory 160, and provided to the DAC 135. In some cases, the audio signal may be retrieved from the memory 160 and processed by the digital signal processing circuit 155 prior to being provided by the DAC 135. The DAC 135 converts the digital-domain audio signal to the analog domain. The analog-domain audio signal may be processed by the reconstruction filter 140 and the programmable gain amplifier circuit 145, and then provided by the programmable gain amplifier circuit 145 to the audio output device 175 to allow playback.

In some embodiments, amplifiers can be utilized in various components of the transmit path and the receive path. In this regard, the amplifiers may be utilized as current steering amplifiers, headphone amplifiers, line out amplifiers, microphone amplifiers, line in amplifiers, etc. With reference to FIG. 1, for example, the amplifiers may be provided in the programmable gain amplifier circuits 110 and/or 145, anti-aliasing filter 115, ADC 120, DAC 135, and/or reconstruction filter 140. The amplifiers can provide amplification to audio signals along with impairments such as noise, offset, and offset drift. Mitigation of such impairments in the amplifiers disposed in the transmit path and the receive path allows for improved audio quality. For example, by mitigating (e.g., cancelling out) the offset in an amplifier output, pop and distortion resulting from the offset (which may cause an audible sound degradation) may also be mitigated.

In some embodiments, the various components or portions thereof (e.g., 105, 110, 115, 120, 125, 130, 135, 140, 145, 150, 155) may be implemented as one or more microprocessors, microcontrollers, application specific integrated circuits (ASICs), programmable logic devices (PLDs) (e.g., field programmable gate arrays (FPGAs), complex programmable logic devices (CPLDs), field programmable systems on a chip (FPSCs), or other types of programmable devices), codecs, and/or other processing devices. In some aspects, such processing devices may execute machine readable instructions (e.g., software, firmware, or other instructions) stored in the memory 160. In this regard, the processing devices may perform any of the various operations, processes, and techniques described herein. In other aspects, such processing devices may be replaced and/or supplemented with dedicated hardware components to perform any desired combination of the various operations, processes, and techniques described herein.

The memory 160 may be implemented as a machine readable medium storing various machine readable instructions and data. For example, in some embodiments, the memory 160 may store an operating system and one or more applications as machine readable instructions that may be read and executed by one or more processing devices to perform the various operations, processes, and techniques described herein. The memory 160 may also store data used by the operating system and/or applications. In some embodiments, the memory 160 may be implemented as non-volatile memory (e.g., flash memory, hard drive, solid state drive, or other non-transitory machine readable mediums), volatile memory, or combinations thereof.

In various embodiments, the audio processing system 100 may include other components and configurations. For example, the audio processing system 100 may include a plurality of audio receive paths for processing audio signals received from a corresponding plurality of audio input devices, and/or a plurality of audio transmit paths for processing a plurality of audio signals for transmission to a plurality of corresponding audio output devices. The audio processing system 100 may also include echo cancellation, noise cancellation, voice activity detection, audio source separation, and other audio processing components. The audio processing system 100 may also include a display to present information to a user of the audio processing system 100. The display may be implemented as a liquid crystal display (LCD), an organic light emitting diode (OLED) display, and/or any other appropriate display. User controls may be provided to receive user input. The user controls may be implemented as one or more physical buttons, keyboards, levers, joysticks, and/or other controls. In some cases, the user controls may be integrated with the display, such as in touchscreen technology. For example, the display may provide graphical user interface to allow a user to select audio for playback, edit stored audio, etc., with the user controls used to facilitate user interaction with the graphical user interface.

Figure 2:
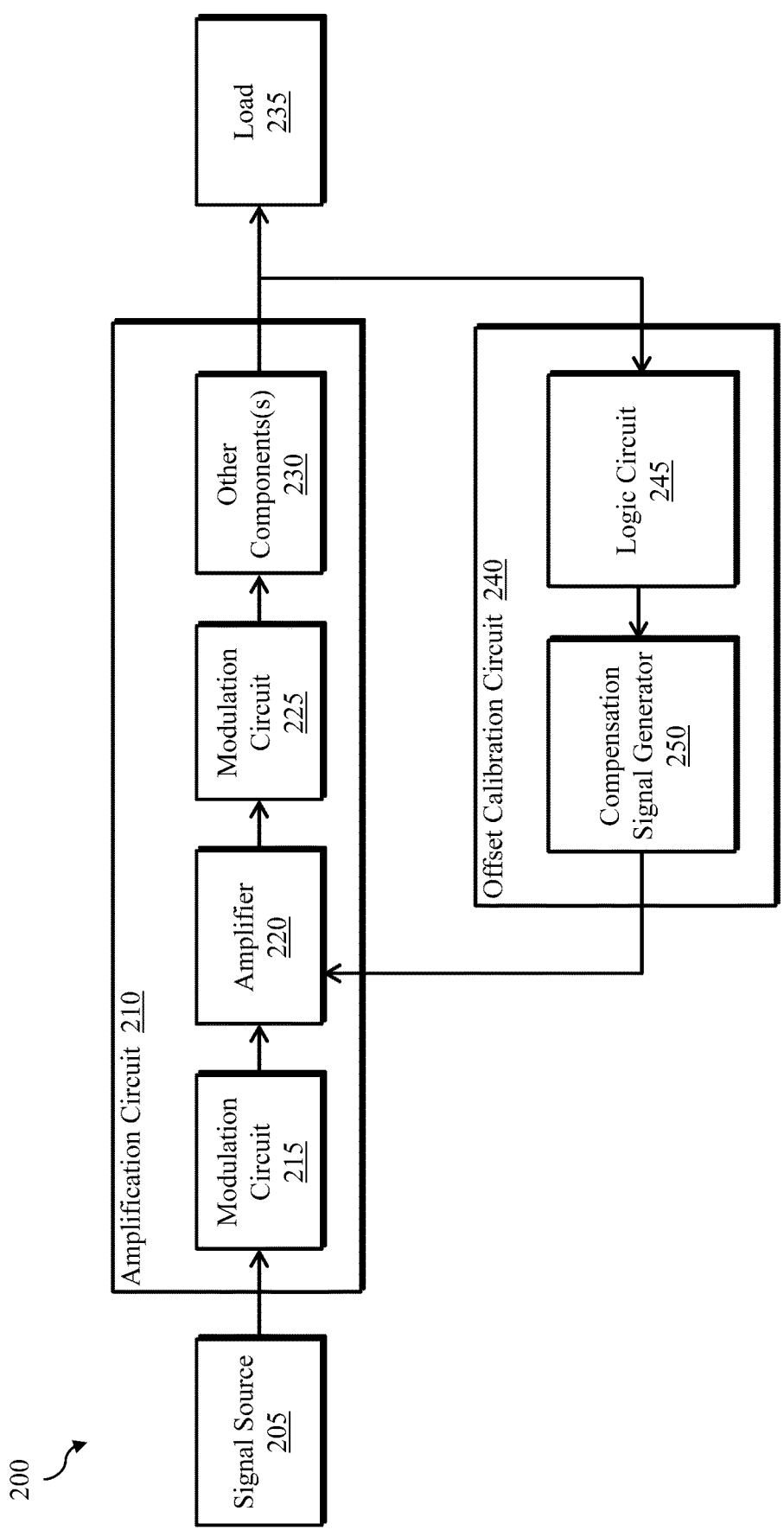
FIG. 2 illustrates a system for facilitating flicker noise, offset, and offset drift mitigation in accordance with one or more embodiments of the present disclosure

FIG. 2 illustrates a system 200 for facilitating noise, offset, and offset drift mitigation in accordance with one or more embodiments of the present disclosure. Not all of the depicted components may be required, however, and one or more embodiments may include additional components not shown in the figure. Variations in the arrangement and type of the components may be made without departing from the scope of the claims as set forth herein. Additional components, different components, and/or fewer components may be provided.

The system 200 includes a signal source 205, an amplification circuit 210, an offset calibration circuit 240, and a load 235. The signal source 205 provides a signal to be processed (e.g., amplified, filtered, etc.) by the amplification circuit 210 and/or offset calibration circuit 240, and the processed signal may be provided to the load 235. For example, the load 235 may be an audio output device (e.g., the audio output device 175). In such a case, the amplification circuit 210 may be considered a driver of the audio output device. As another example, the system 200 may be implemented in the programmable gain amplifier circuit 110 of FIG. 1, and the load 235 may include components downstream of the programmable gain amplifier circuit 110 (e.g., the anti-aliasing filter 115, ADC 120).

The amplification circuit 210 includes modulation circuits 215 and 225 and an amplifier 220. The modulation circuit 215 modulates the signal from the signal source 205 and provides the modulated signal to the amplifier 220. The amplifier 220 applies gain (e.g., amplifies) the modulated signal to provide an amplified signal. In one embodiment, the amplifier 220 may add impairments (e.g., noise, offset, offset drift) such that the amplified signal includes an amplified version of the modulated signal along with the impairments. The modulation circuit 225 demodulates the amplified modulated signal. In one embodiment, the demodulation performed by the modulation circuit 225 may correspond to the modulation performed by the modulation circuit 215, such that the modulation circuits 215 and 225 form a modulation-demodulation pair.

In some embodiments, the modulation circuit 215 upmodulates an input signal received by the modulation circuit 215 from the signal source 205 such that a signal output by the modulation circuit 215 is in a higher frequency range than the input signal from the signal source 205. The modulation circuit 225 downmodulates the input signal received by the modulation circuit 225 such that a signal output by the modulation circuit 225 is in a lower frequency range than the input signal received by the modulation circuit 225. In such embodiments, upmodulation and downmodulation may be referred to as upconversion and downconversion, respectively. In one embodiment, the modulation circuits 215 and 225 may include chopper circuits, mixer circuits, and/or other circuits to perform appropriate frequency conversion of an amplified signal.

Taking into consideration the noise and/or offset at low frequencies, such as flicker noise and offset, added by the amplifier 220, the modulation circuit 215 modulates an input signal to a higher frequency range to provide a modulated signal. The amplifier 220 applies gain to the modulated signal, which is at the higher frequency, and adds flicker noise and/or offset, which are at low frequencies. The modulation circuit 225 modulates a received input such that the amplified modulated signal is downmodulated to a lower frequency range (e.g., the frequency range of the input signal from the signal source 205) and the noise and/or offset are upmodulated to a higher frequency range. In this manner, the flicker noise and offset associated with the amplification circuit 210 is separated, in the frequency-domain, from the input signal from the signal source 205.

Although the gain applied by the amplifier 220 and other amplifiers is generally considered to involve amplification (e.g., gain above 1), it is noted that the applied gain may include unity gain (e.g., no applied gain), zero gain (e.g., nulled signal), negative gain (e.g., inverted signal), attenuation (e.g., gain with magnitude between 0 and 1), or amplification (e.g., gain above 1).

In addition, the amplification circuit 210 may include one or more other components 230. By way of non-limiting example, the other component(s) 230 may include an amplifier(s) to provide additional amplification stage(s), a filter(s) to provide filtering, and/or other processing circuitry. Although the other component(s) 230 are illustrated as being serially connected to the modulation circuit 225 in FIG. 2, the other component(s) 230 may be distributed at various points in the amplification circuit 210. In one example, the other component(s) 230 may include a processing circuit (e.g., a filter) before the modulation circuit 215 to process (e.g., filter) the signal from the signal source 205 and provide the filtered signal to the modulation circuit 215. As another example, the other component(s) 230 may include one or more processing circuits between the modulation circuit 215 and the amplifier 220 and/or between the amplifier 220 and the modulation circuit 225.

An output signal of the amplification circuit 210 may be provided to the load 235 and/or the offset calibration circuit 240. For example, a last amplification stage of the amplification circuit 210 may provide the output signal to the load 235. In this example, the last amplification stage may be provided by the amplifier 220 in the case that the amplification circuit 210 is a single-stage amplifier. In another case, the last amplification stage may be provided by an amplifier (e.g., part of the other component(s) 230) downstream of the amplifier 220.

The offset calibration circuit 240 includes a logic circuit 245 and a compensation signal generator 250. The offset calibration circuit 240 may utilize the output of the amplification circuit 210 to determine the offset associated with the amplification circuit 210 and compensate for (e.g., reduce or eliminate the effect of) the offset present in the output of the amplification circuit 210. The logic circuit 245 may set a control based on the output signal from the amplification circuit 210, and provide the control signal to the compensation signal generator 250. In some cases, the control signal may be provided as a bit sequence to the compensation signal generator 250. The compensation signal generator 250 generates one or more compensation signals based on the control signal from the logic circuit 245 and applies the compensation signal(s) on the amplification circuit 210 to adjust an output of the amplification circuit 210. In some cases, each compensation signal may be an electrical signal (e.g., voltage signals, current signals) applied on the amplification circuit 210. As an example, compensation signals may include one or more currents applied at an output of the amplifier 220. Different control signals may be associated with different compensation signals (e.g., different values for the compensation signals).

In some aspects, the offset calibration circuit 240 may operate iteratively to determine and compensate for the offset associated with the amplification circuit 210. The logic circuit 245 may set the control signal to a certain value and the compensation signal generator 250 may generate the compensation signal based on the set control signal. The logic circuit 245 may then set the control signal to a different value based on a present output of the amplification circuit 210, and the compensation signal generator 250 may generate a corresponding compensation signal based on the new control signal. In various embodiments, with each iteration, the generated compensation signal converges toward a compensation signal that mitigates (e.g., reduces or eliminates an effect of) the offset. In one embodiment, the offset calibration circuit 240 may be referred to as a calibration loop, an offset reduction loop, a ripple reduction loop, or variants thereof (e.g., offset calibration loop).

In some embodiments, the system 200 may implement a calibration phase and an operation phase. During the calibration phase, the signal source 205 may be turned off or utilized to provide a signal (e.g., a predetermined signal) to facilitate determining and compensating of the offset. When turned off, the signal source 205 may be considered as providing a zero input (e.g., also referred to as null signal). For example, in the case that the signal source 205 is turned off, a non-zero output of the amplification circuit 210 may be indicative of the offset associated with the amplification circuit 210. The logic circuit 245 and compensation signal generator 250 may generate control signals and compensation signals, respectively, to compensate for the offset.

After the calibration phase is completed (e.g., the offset is compensated for to an acceptable level), the system 200 may transition to the operation phase to process signals (e.g., audio signals) provided by the signal source 205. The compensation signal(s) determined during the calibration phase to compensate for the offset may be fixed and used during the operation phase. Information associated with the offset may be stored (e.g., in the memory 160) and may be retrieved/utilized to generate a compensation signal(s) to compensate for the offset. Such information may indicate a value(s) for the compensation signal(s), value(s) of the offset, and/or other information that may be utilized to generate the compensation signal(s). The compensation signal(s) may be generated and applied by an offset compensation circuit. The offset compensation circuit may be the compensation signal generator 250, and/or may be other circuitry. For example, the control circuits 125 and 150 of FIG. 1 may each include an offset compensation circuit that can utilize information associated with the offset (e.g., stored in the memory 160) to generate the offset compensation signals for the amplification circuit 210.

In some cases, the calibration phase may be performed during startup of the system 200, periodically (e.g., after a threshold amount of time has passed since a prior calibration phase was performed), and/or in response to drifting of the offset. For instance, drift in the offset may be detected as a ripple in an output signal of an audio output device, which may be audible to a user. In this regard, to facilitate mitigation of the drift associated with the offset, calibration may be performed to determine (e.g., converge towards) a compensation signal(s) that mitigates the drifted offset.

In some embodiments, the load 235 and/or the offset calibration circuit 240 may be switchably coupled to the amplification circuit 210. For example, during the calibration phase, the offset calibration circuit 240 may be connected to the amplification circuit 210 and the load 235 may be disconnected from the amplification circuit 210. In some cases, the offset calibration circuit 240 may be detached from the amplification circuit 210 such that the offset calibration circuit 240 may be utilized to perform a calibration phase on another circuit (e.g., another amplification circuit). In other cases, the offset calibration circuit 240 may remain attached to the amplification circuit 210, and the compensation signal generator 250 may be utilized to generate the compensation signal(s) for the amplification circuit 210. In some embodiments, the calibration phase and the operation phase may occur in parallel, such that the system 200 may be operated to process signals from the signal source 205 while adaptively adjusting the compensation signal(s) (e.g., due to drift in the offset over time).

Figure 3:
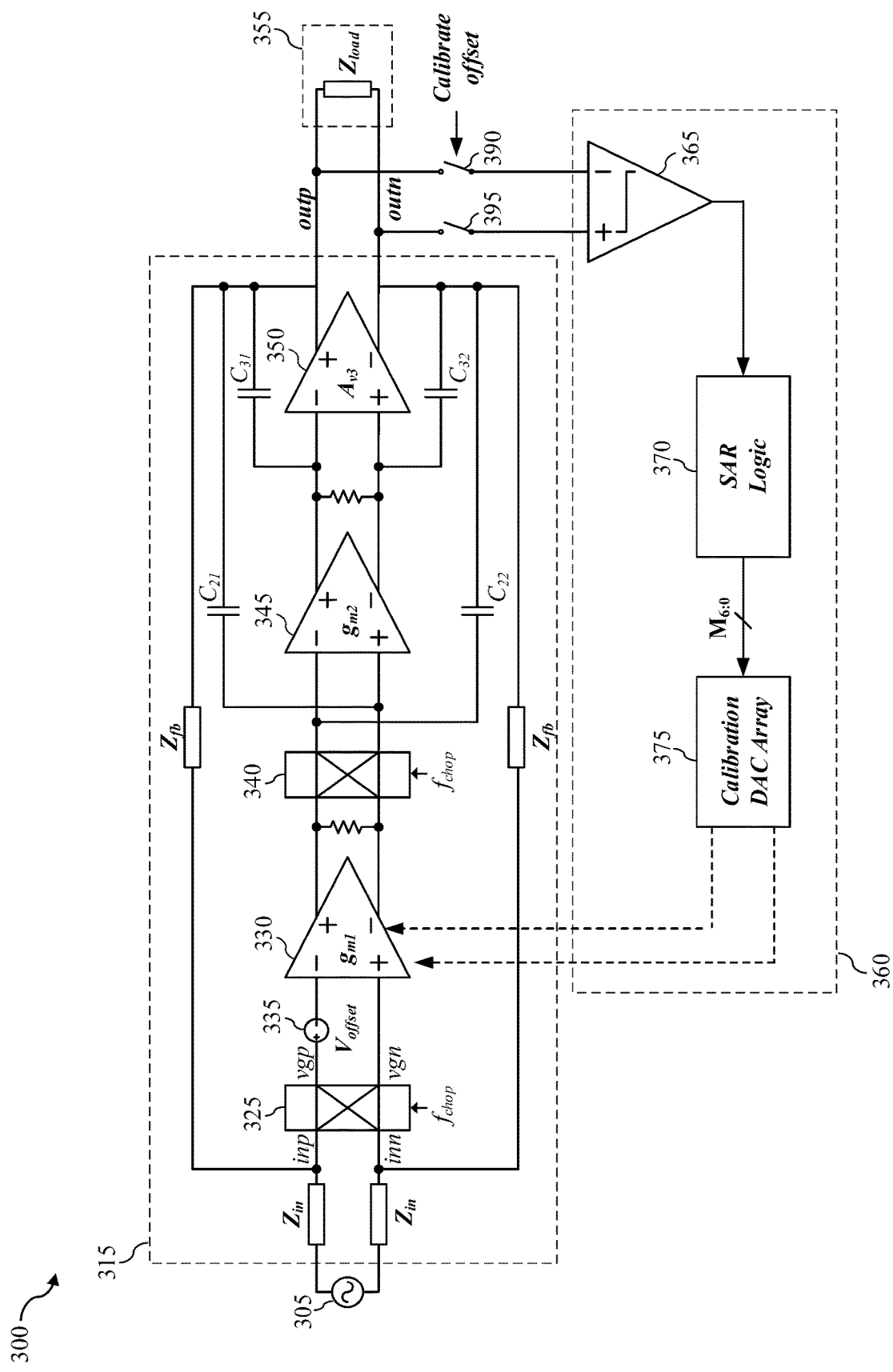
FIG. 3 illustrates a system for facilitating noise, offset, and offset drift mitigation in accordance with one or more embodiments of the present disclosure.

FIG. 3 illustrates a system 300 for facilitating noise, offset, and offset drift mitigation in accordance with one or more embodiments of the present disclosure. Not all of the depicted components may be required, however, and one or more embodiments may include additional components shown in the figure. Variations in the arrangement and type of the components may be made without departing from the scope of the claims as set forth herein. Additional components, different components, and/or fewer components may be provided.

The system includes a signal source 305, an amplification circuit 315, a load 355, and an offset calibration circuit 360. In one embodiment, the signal source 305, amplification circuit 315, load 355, and offset calibration circuit 360 may be, may include, or may be a part of the signal source 205, amplification circuit 210, load 235, and offset calibration circuit 240, respectively, of FIG. 2.

The signal source 305 provides a signal to be processed (e.g., amplified, filtered, etc.). The amplification circuit 315 includes chopper circuits 325 and 340 and amplifiers 330, 345, and 350. The amplifiers 330, 345, and 350 may be referred to as a first, second, and third stage amplifier or amplification stage, respectively, or simply a first, second, and third stage, respectively, of the amplification circuit 315.

In an aspect, since the amplification circuit 315 includes chopper circuits, the amplification circuit 315 may be referred to as a chopped amplification circuit or simply a chopped amplifier. The offset calibration circuit 360 includes a comparator circuit 365, a successive-approximation-register (SAR) logic circuit 370, and a calibration DAC array 375. In an aspect, the chopper circuits 325 and 340 may be, may include, or may be a part of, the modulation circuits 215 and 225, respectively, of FIG. 2. Although FIG. 3 shows a three stage amplification circuit (e.g., with the amplifiers 330, 345, and 350), fewer amplification stages (e.g., one or two stages) or more amplification stages (e.g., four or more stages) can be used.

The amplification circuit 315 also includes a feedback impedance circuit (e.g., feedback resistance circuit), represented by $Z_{fb}$, compensation capacitors $C_{21}$ and $C_{22}$ of the amplifier 345, and compensation capacitors $C_{31}$ and $C_{32}$ of the amplifier 350. The feedback impedance circuit and compensation capacitors effectuate a negative feedback to provide stability to the amplification circuit 315. $Z_{in}$ are the input impedance (e.g., input resistors) of the amplification circuit 315, and together with the feedback impedance circuit $Z_{fb}$ are used to set the gain of the amplification circuit 315.

In some cases, such as shown in FIG. 3, the offset calibration circuit 360 may be switchably coupled to the amplification circuit 315 via switches 390 and 395. For example, the switches 390 and 395 may couple the offset calibration circuit 360 to the amplification circuit 315 during a calibration phase of the system 300 to determine a compensation signal(s) to compensate the offset. In FIG. 3, the offset of the amplifier 330 is represented by a voltage offset 335.

In some aspects, the calibration phase may be performed during a startup of the amplification circuit 315, periodically (e.g., after a period of time has elapsed since a previous calibration), and/or as appropriate based on output signals of the amplification circuit 315 (e.g., a ripple is present in the output signals of the amplification circuit 315). After calibrating the offset calibration circuit 360, the offset calibration circuit 360 may, but need not, be decoupled from the amplification circuit 315 and subsequently coupled to another amplification circuit (not shown in FIG. 2) to allow calibration of the other signal amplifier circuit. During an operation phase and also during the calibration phase, the amplification circuit 315 is coupled (e.g., connected) to the load 355. In this regard, by having the load 355 coupled during the calibration phase, loading effects of the load 355 are taken into consideration for the calibration of the amplification circuit 315. The compensation signal(s) determined during the calibration phase may be utilized during the operation phase to compensate for the offset. In some embodiments, the calibration phase and the operation phase may occur in parallel, such that the system 300 may be operated to process signals from the signal source 305 while adaptively adjusting the compensation signal(s) (e.g., to mitigate drift in the offset over time).

Figure 4A:
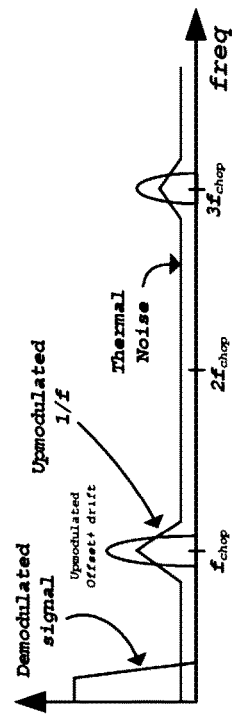
FIGS. 4A-4E illustrate examples of frequency domain representations of a signal at various points of an amplification circuit.
Figure 4B:
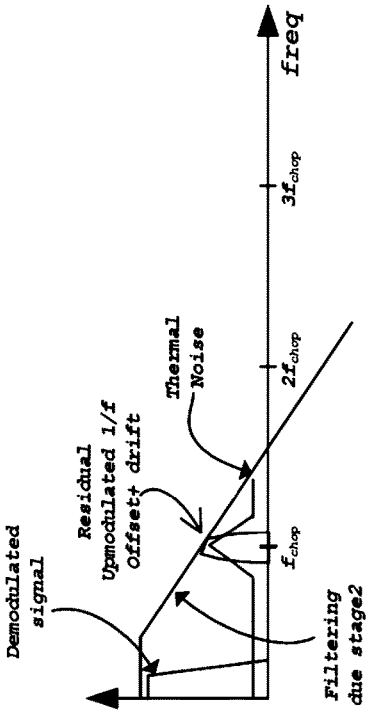
Figure 4C:
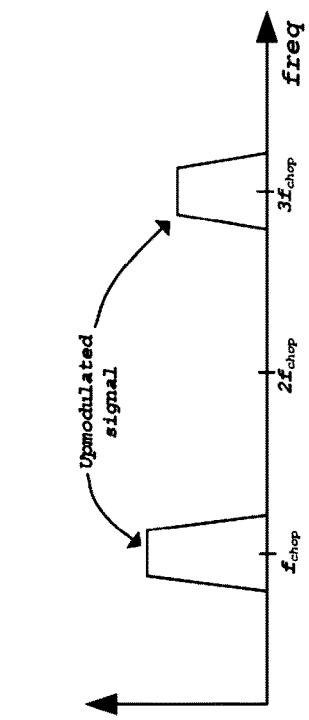

Operation of the amplification circuit 315 is described with reference to FIGS. 4A-4E, which illustrates examples of frequency domain representations of a signal at various points of the amplification circuit 315 in the case without offset compensation (e.g., the offset calibration circuit 360 is turned off). At some of these points, impairments may be present. FIG. 4A illustrates an example of a signal provided by the signal source 305. The amplification circuit 315 receives the signal from the signal source 305. FIG. 4B illustrates an output of the chopper circuit 325, represented as signals (e.g., differential signals) vgp and vgn in FIG. 3. As shown, the chopper circuit 325 upmodulates the signal to a frequency $f_{chop}$ and to odd multiples of $f_{chop}$. The amplifier 330 receives the upmodulated signal from the chopper circuit 325. An example of the chopper circuit 325 is described below with respect to FIG. 6. FIG. 4C illustrates an output of the amplifier 330. In this regard, the amplifier 330 amplifies the upmodulated signal, and adds noise (e.g., flicker noise, thermal noise) and offset (e.g., including offset drift). Usually, the frequency $f_{chop}$ may be set above a 1/f corner of the flicker noise. For example, the frequency $f_{chop}$ may be in the tens of kilohertz. However, the 1/f corner depends on the level of the thermal noise of the circuit. If the thermal noise power spectral density is lower, then the 1/f corner can be at a higher frequency, which implies that the chopping frequency should be higher than that 1/f corner frequency.

Figure 4D:
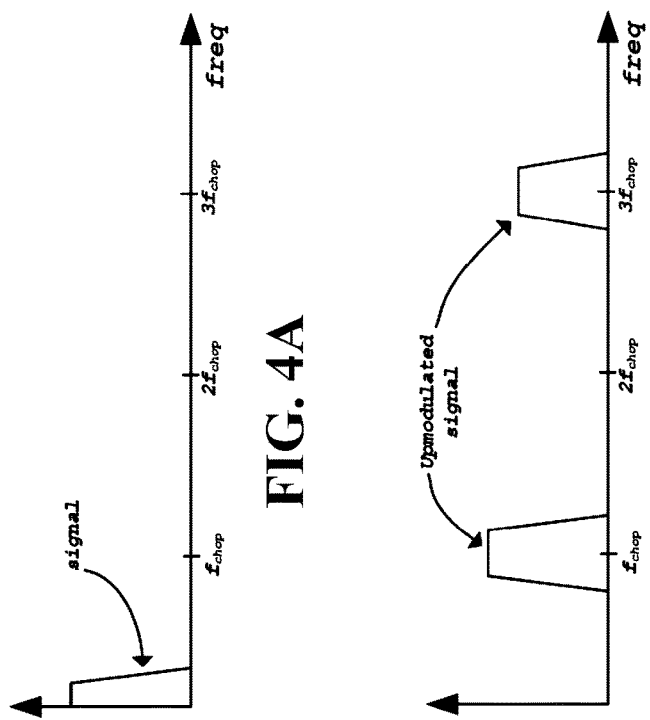
Figure 4E:
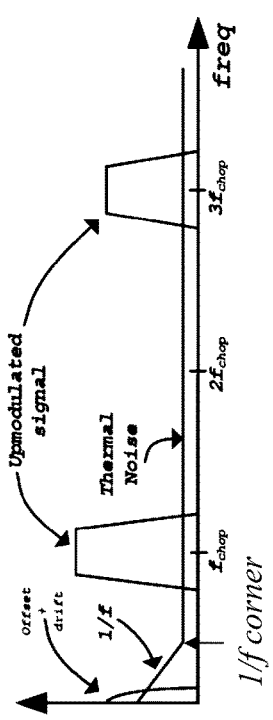

The chopper circuit 340 receives the amplified upmodulated signal, noise, offset, and offset drift. FIG. 4D illustrates an output of the chopper circuit 340. As shown, the chopper circuit 340 demodulates the amplified upmodulated signal down to baseband (e.g., the frequency of the signal from the signal source 305), and upmodulates the flicker noise, offset, and offset drift. In this regard, the chopper circuit 340 performs a demodulation that complements the modulation performed by the chopper circuit 325. The chopper circuit 340 modulates the flicker noise, offset, and offset drift to $f_{chop}$ and $(2m+1)f_{chop}$ for integer m (e.g., the odd harmonics of $f_{chop}$). The amplifier 345 receives an output of the chopper circuit 340. FIG. 4E illustrates an output of the amplifier 345. In this regard, the frequency compensation implemented by the Miller capacitance $C_{21}$ and $C_{22}$ around the second stage amplifier 345 and the third stage amplifier 350 of the amplification circuit 315 causes a resulting frequency response roll-off that provides a filtering effect on the output of the chopper circuit 340. The amplifier 350 receives an output of the amplifier 345 and processes the output to provide an output of the amplification circuit 315, represented as outputs (e.g., differential outputs) outp and outn in FIG. 3.

With the flicker noise being modulated to a frequency different from (e.g., higher than) the amplified signal at baseband, the flicker noise is separated from the amplified audio signal and effectively mitigated by the frequency response roll-off of the amplification circuit 315, provided that the modulating or the chopping frequency is higher than the −3 dB bandwidth of the amplifier response, which generally is the case for audio amplifiers. Therefore, upmodulated flicker noise and offset are mitigated to some extent by the amplifier response. Usually, the upmodulated offset voltage is of a larger magnitude than the upmodulated flicker noise. In some cases, additional filtering may be utilized to reduce or eliminate the offset and flicker noise at the higher frequencies to further mitigate its effect. For example, the filtering may be provided by one or more amplification stages after the amplifier, as shown in FIG. 4E. Although the modulation and corresponding demodulation are described with reference to chopping circuits and chopping frequency, other modulation techniques may be utilized.

As shown in FIGS. 4C-4E, the impairments presented by the amplifier 330 propagate through the amplification circuit 315 and are present at the outputs outp and outn of the amplification circuit 315. In this regard, the outputs outp and outn are a function of the voltage offset 335. The offset calibration circuit 360 is utilized to cancel out the offset associated with the amplification circuit 315 (e.g., the offset of the amplifier 330 represented as the voltage offset 335). Initially, the SAR logic circuit 370 may set an n-bit sequence (e.g., a predetermined n-bit sequence) as a control signal to control operation of the calibration DAC array 375 using the set n-bit sequence. The calibration DAC array 375 may generate one or more compensation signals based on the n-bit sequence and provide the compensation signals to the amplification circuit 315. In some cases, different n-bit sequences are associated with different compensation signals. An example of the calibration DAC array 375 is described below with respect to FIGS. 7, 8A, and 8B.

The comparator circuit 365 receives the outputs outp and outn from the amplifier 350 and generates a comparator output based on a difference between the outputs outp and outn. In one embodiment, the comparator output may be indicative of whether outp or outn is larger. The outputs outp and outn are a function of the voltage offset 335 and the compensation signal. The SAR logic circuit 370 receives the comparator output and accordingly sets the control signal to configure the calibration DAC array 375, such that the compensation signal can be adjusted to facilitate reduction or removal of the voltage offset 335. The process of generating a comparator output based on a current set of outputs of the amplification circuit 315, setting a control signal based on the comparator output, and generating a compensation signal based on the control signal may be repeated iteratively to allow the offset calibration circuit 360 to converge toward compensation signals that reduce or eliminate the voltage offset 335. In this regard, the compensation signals compensate for the voltage offset 335 such that the effect of the voltage offset 335 on the outputs outp and outn is cancelled out by the compensation signals.

In an embodiment, the compensation signals may be provided to an output of the amplifier 330, such that the chopper circuit 340 receives an output signal from the amplifier 330 as well as the compensation signals from the calibration DAC array 375. For non-zero compensation signals, the compensation signals generally have an effect on the outputs outp and outn of the amplification circuit 315.

As one example of operating the offset calibration circuit 360, the SAR logic circuit 370 may generate 7-bit sequences (e.g., also referred to as 7-bit codes), represented as $M_{6:0}$. The bit sequence $M_{6:0}$ may be represented as seven bits $b_6 b_5 b_4 b_3 b_2 b_1 b_0$, with $b_6$ being the most significant bit (MSB) and $b_0$ being the least significant bit (LSB). Initially, the SAR logic circuit 370 may set a control signal to a code 1000000 and provide this code to the calibration DAC array 375. The calibration DAC array 375 may generate compensation signals in accordance with the code 1000000 and apply the compensation signals on the amplification circuit 315. At the output of the amplification circuit 315, the comparator circuit 365 compares the outp and outn subsequent to the compensation signals having been applied to the amplification circuit 315.

In some cases, the comparator circuit 365 may determine which of the outp and outn is larger. When the outp is larger, the SAR logic circuit 370 may maintain the MSB at 1 and set a next bit $b_5$ to 1, such that the next code provided to the calibration DAC array 375 is 1100000. The calibration DAC array 375 may generate a compensation signals in accordance with the code 1100000 and apply the compensation signal on the amplification circuit 315. When the outn is larger, the SAR logic circuit 370 may set the MSB to 0 and set the next bit $b_5$ to 1, such that the next code provided to the calibration DAC array 375 is 0100000. The calibration DAC array 375 may generate compensation signals in accordance with the code 0100000 and apply the compensation signals to the amplification circuit 315. This process of maintaining a current bit $b_k$ at 1 or flipping the bit to 0 and setting a next bit $b_{k-1}$ to 1 can be iteratively performed for each of the seven bits of the bit sequence. Each n-bit sequence may be associated with a corresponding set of compensation signals to be generated by the calibration DAC array 375.

With each iteration of the comparator circuit 365 comparing the outp and outn, the SAR logic circuit 370 generating a code based on the output of the comparator circuit 365, and the calibration DAC array 375 providing a current signal at an output of the amplifier 330 in accordance with the code from the SAR logic circuit 370, the compensation signals from the calibration DAC array 375 converge to signals that mitigate (e.g., cancel out, compensate for) the voltage offset 335. With the voltage offset 335 compensated for, the upmodulated offset, which would otherwise show up as a ripple, is removed, or is substantially reduced (e.g., small ripple present) at the outputs outp and outn of the amplification circuit 315.

For example, at the end of calibration, a final bit sequence for the control signal may be 0100100, such that the calibration DAC array 375 generates compensation signals in accordance with the code 0100100 and applies the compensation signals on the amplification circuit 315 to compensate for the voltage offset 335. In some cases, information indicative of the final bit sequence may be stored (e.g., in the memory 160) and/or utilized to configure an offset calibration circuit to generate compensation signals based on the information to compensate for the voltage offset 335. Although a 7-bit calibration code is utilized, fewer or more bits can be utilized as appropriate based on application. For example, for more accurate ripple reduction, higher bit calibration codes may be utilized.

The SAR logic circuit 370 may be utilized to determine the compensation signals that compensate for the offset (e.g., cancels out the offset) after a number of iterations (e.g., clock cycles). For example, for 7-bit control signals, the SAR logic circuit 370 may utilize seven clock cycles (e.g., or multiples of seven clock cycles) for convergence. In this example, each clock cycle may be utilized to determine whether to set a bit of the control signal to 0 or 1. Once the offset is determined, such as after a predetermined number of iterations and/or once the offset is sufficiently suppressed (e.g., ripple is no longer present in an audio output signal), the compensation signals to be utilized may be fixed and/or information indicative of the compensation signals may be stored.

In a case that the compensation signals does not converge, the offset calibration circuit 360 may be reconfigured to adjust a range of values of the compensation signals that can be generated by the calibration DAC array 375. In this case, existing control signals generated by the SAR logic circuit 370 may be remapped to a different set of compensation signals, and/or a different set of control signals associated with a different set of compensation signals may be utilized by the SAR logic circuit 370.

Although the offset calibration circuit 360 includes the comparator circuit 365, SAR logic circuit 370, and calibration DAC array 375, other components can be utilized alternatively and/or in addition. As an example, a flash ADC and/or other ADC may be used alternatively and/or in addition to the SAR logic circuit 370. As another example, the offset calibration circuit 360 may include any combination of component that iteratively generates compensation signals, adjusts the compensation signals based on changes in the outputs of the amplification circuit 315, and converges towards the compensation signals that compensate for the offset. Furthermore, in some embodiments, as shown in FIG. 3, chopping is performed by the chopper circuit 325 prior to the offset being mitigated by the offset calibration circuit 360. In other embodiments, the chopping may be performed after the offset has been compensated for by the offset calibration circuit 360. In other embodiments, the chopping and compensating for the offset may occur concurrently.

Although FIG. 3 shows a differential output and associated differential circuit, a single-ended output (e.g., for single-ended headphones) may be utilized with appropriate adjustments to the circuitry. For example, the comparator circuit 365 may compare a signal-ended output signal to ground, the SAR logic circuit 370 may generate a control signal based on the comparator output, and the calibration DAC array 375 may generate a compensation signal based on the control signal.

Figure 5:
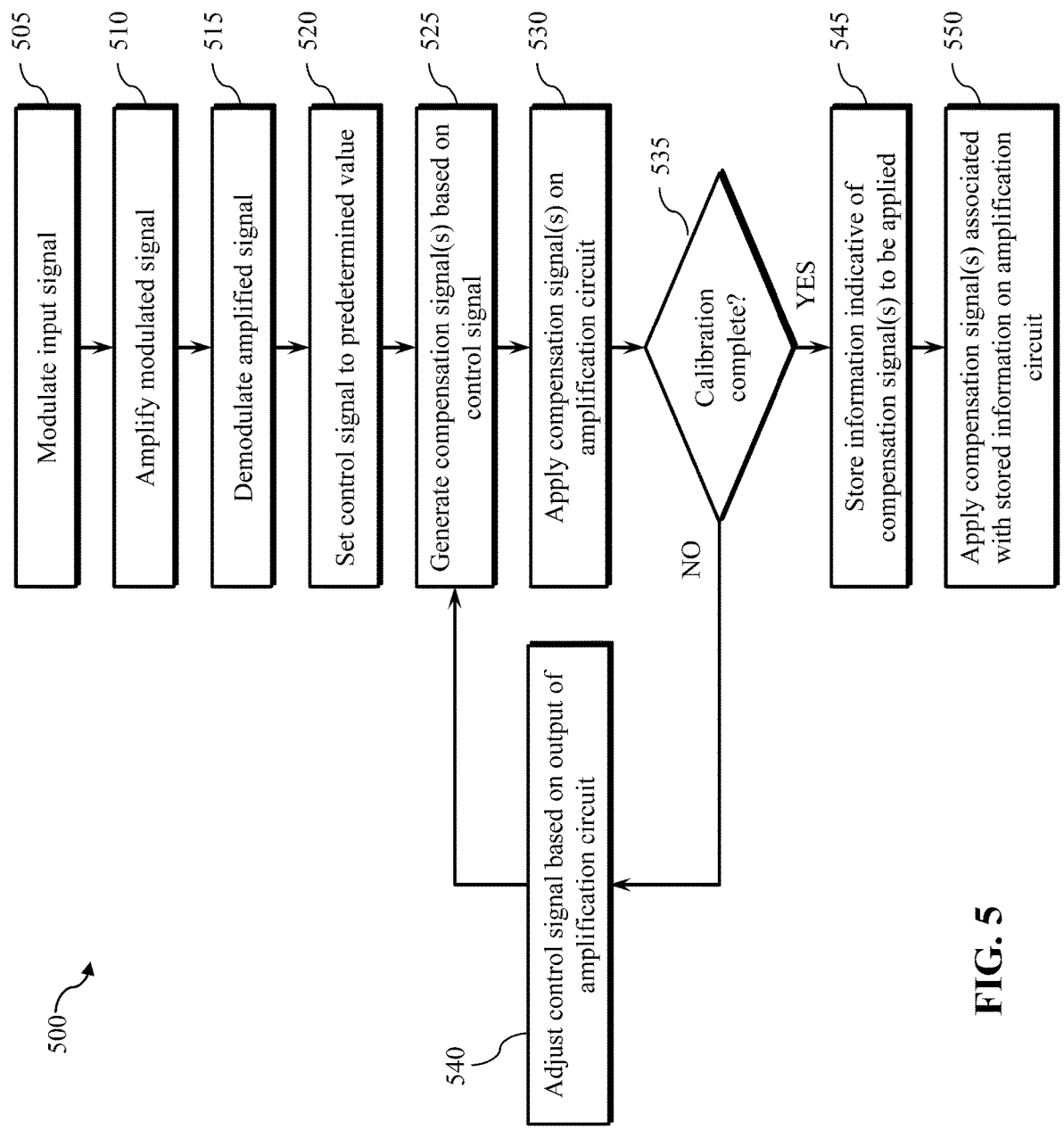
FIG. 5 illustrates a flow diagram of an example process for facilitating noise, offset, and offset drift mitigation in accordance with one or more embodiments of the present disclosure.

FIG. 5 illustrates a flow diagram of an example process 500 for facilitating mitigation of flicker noise, offset, and offset drift in accordance with one or more embodiments of the present disclosure. For explanatory purposes, the example process 500 is described herein with reference to the system 300, although the example process 500 may be utilized with other systems. Note that one or more operations may be combined, omitted, and/or performed in a different order as desired.

At block 505, the chopper circuit 325 modulates a signal. The chopper circuit 325 may upconvert the signal to a chopper frequency $f_{chop}$ and odd multiples of $f_{chop}$. At block 510, the amplifier 330 amplifies the modulated signal from the chopper circuit 325. Such amplification may increase a signal power of the modulated signal, but add impairments such as noise (e.g., flicker noise, thermal noise), offset, and offset drift. At block 515, the chopper circuit 340 demodulates the amplified modulated signal. In some cases, the chopper circuit 340 downconverts the amplified modulated signal (e.g., to a frequency of the signal from the signal source 305) and upconverts the impairments (e.g., to $f_{chop}$ and odd harmonics of $f_{chop}$).

At block 520, the SAR logic circuit 370 sets a control signal to a predetermined value. In an aspect, the SAR logic circuit 370 may set the control signal to a 1 at the MSB and 0 for the remaining bits (e.g., 1000000). At block 525, the calibration DAC array 375 generates compensation signals based on the control signal. At block 530, the calibration DAC array 375 applies the compensation signals on the amplification circuit 315. For example, the calibration DAC array 375 may apply the compensation signals (e.g., current signals) at an output (e.g., on output lines) of the amplifier 330.

At block 535, a determination is made as to whether the calibration is complete. In one embodiment, when using the SAR logic circuit 370, the calibration may be complete when each of the bits of the control signal has been set (e.g., starting with setting the bit sequence to 1000000) in response to the output of the amplification circuit 315 during each iteration. In another aspect, the calibration may be complete prior to each of the bits of the control signal having been set sequentially (e.g., and associated compensation signals tested), such as when the offset is determined to be sufficiently compensated for. For example, for the SAR logic circuit 370 using n bit sequences, the offset may be determined to be sufficiently compensated for prior to all n bits having been individually set.

If the determination is made that the calibration is not complete, the process 500 proceeds to block 540 for a next iteration of calibration. At block 540, the SAR logic circuit 370 adjusts the control signal based on the output of the amplification circuit 315. The output of the amplification circuit 315 is based at least in part on the applied compensation signals set at block 530. In some cases, the SAR logic circuit 370 may adjust the control signal based on the comparator output generated by the comparator circuit 365 in response to the output (e.g., differential outputs) of the amplification circuit 315. The calibration DAC array 375 then generates compensation signals based on the adjusted control signal (at block 525) and applies the compensation signals on the amplification circuit 315 (at block 530).

If the determination is made that the calibration is complete, the process 500 proceeds to block 545. At block 545, the offset calibration circuit 360 (e.g., the SAR logic circuit 370) provides information indicative of the compensation signals generated by the calibration DAC array 375 at a last iteration of the calibration phase. The information may include values of the compensation signals, value of the control signal associated with the compensation signals, and/or generally any information that may be utilized to determine (e.g., derive) the compensation signals to be applied to mitigate the offset. At block 550, an offset calibration circuit applies the compensation signals associated with the stored information on the amplification circuit 315 to mitigate the offset. The offset calibration circuit may be implemented in the control circuits 125 and/or 150, and/or other circuit that can provide the compensation signals to mitigate the offset. In cases that the offset calibration circuit 360 remains connected to the amplification circuit 315 after calibration, the calibration DAC array 375 may be utilized to apply the compensation signals.

Figure 6:
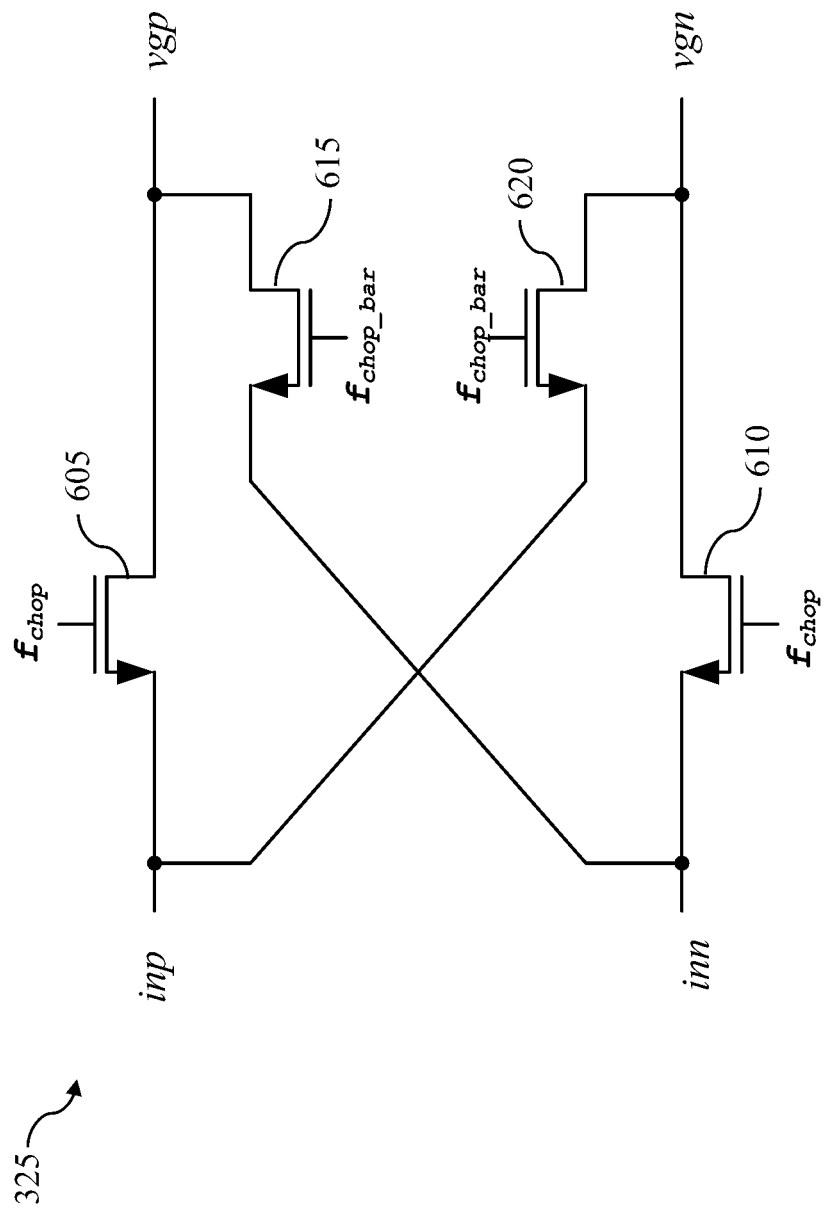
FIG. 6 illustrates an example of a modulation/demodulation circuit.

FIG. 6 illustrates an example of the chopper circuit 325 in accordance with one embodiment. The chopper circuit 325 includes transistors 605, 610, 615, and 620. In an embodiment, the transistors 605, 610, 615, and 620 may be controlled using square waves that switch from a high signal state to a low signal state, and vice versa, with a frequency of $f_{chop}$. In this regard, the transistors 605 and 610 are turned on or off based on a first square wave that switches from high to low, and vice versa, with a frequency of $f_{chop}$, and the transistors 615 and 620 are turned on or off based on a second square wave that switches from high to low, and vice versa, with a frequency of $f_{chop}$. The first square wave and the second square wave are complementary square waves, in which the first square wave is in a high signal state (e.g., logic 1) when the second square wave is in a low signal state (e.g., logic 0) and the first square wave is in a low signal state when the second square wave is in a high signal state. When the transistors 605 and 610 are turned on and the transistors 615 and 620 are turned off, the inputs inn and inp are coupled to the outputs vgn and vgp, respectively, of the chopper circuit 325. When the transistors 605 and 610 are turned off and the transistors 615 and 620 are turned on, the inputs inn and inp are coupled to the outputs vgp and vgn, respectively. Although FIG. 6 is described with respect to the chopper circuit 325, the same or similar architecture may be used for the chopper circuit 340.

FIG. 7 illustrates an example of the calibration DAC array 375 and associated connections to the amplification circuit 315 in accordance with one or more embodiments of the present disclosure. The calibration DAC array 375 includes tunable current sources 705 and 710, which may also be referred to as current generators. The tunable current sources 705 and 710 may generate a current $I_n$ and $I_p$, respectively. In some cases, $I_n$ and $I_p$ may have the same magnitude but opposite polarity. With reference to FIG. 3, the tunable current source 705 may provide the current $I_n$ to one output of the amplifier 330 and the tunable current source 710 may provide the current $I_p$ to another output of the amplifier 330. In this regard, the compensation signals generated by the calibration DAC array 375 include the current signals $I_n$ and $I_p$. In FIG. 7, the currents $I_n$ and $I_p$ may be utilized to compensate for (e.g., cancel out) the offset (e.g., the voltage offset 335) associated with the amplification circuit 315 by either adding a current to one side of the amplifier 330 and not the other, or by adding a current to one side and subtracting an equal current from the other side. The currents $I_n$ and $I_p$ may be referred to as nulling currents.

FIG. 8A illustrates an example of the tunable current source 705 in accordance with one or more embodiments of the present disclosure. The tunable current source 705 may include an array of current sources. Each current source may be implemented with one or more transistors (e.g., n-type MOS transistors, p-type MOS transistors, and/or other transistors). In FIG. 8A, the tunable current source 705 includes transistors 805, 810, and 815 are n-type MOS transistors connected to ground. The transistors 805, 810, and 815 help sink the currents $I_{n6}$, $I_{n5}$, and $I_{n0}$, respectively. The ellipses between the transistors 810 and 815 may represent one or more additional transistors. The calibration DAC array 375 may receive control signals from the SAR logic circuit 370. Based on the control signals, the calibration DAC array 375 may activate (e.g., on, turn on) or deactivate (e.g., off, turn off) each current source and, in doing so, add a nulling current to one side of the amplifier 330, and nulling the offset at its output and thereby compensating for (e.g., nulling) the offset between outp and outn.

In FIG. 8A, the tunable current source 705 may be represented as n=7 current sources providing current $I_{n0}$, $I_{n1}$, . . . , and $I_{n6}$, with each current source being activated or deactivated via a corresponding switch. Although FIG. 8A shows one current source per column, each current source shown in FIG. 8A may be implemented using one or more current sources. For example, the current source $I_{n5}$ may be a single current source providing a current $I_{n5}$ or may be multiple current sources that equivalently provide a current Is. Similarly, each switch shown in FIG. 8A may represent a single switch or a stack of switches. In some cases, the currents may be implemented with a binary distribution, such that $I_{n0}=I$, $I_{n1}=2I$, . . . , and $I_{n6}=2^5I$.

FIG. 8B illustrates an example of the tunable current source 710 in accordance with one or more embodiments of the present disclosure. The description of FIG. 8A generally applies to FIG. 8B. In FIG. 8B, the tunable current source 710 includes transistors 820, 825, and 830 are n-type MOS transistors connected to ground and help sink the currents $I_{p6}$, $I_{p5}$, and $I_{p0}$, respectively. The ellipses between the transistors 825 and 830 may represent one or more additional transistors. The tunable current source 710 may be represented as n=7 current sources providing current $I_{p0}$, $I_{p1}$, . . . , and $I_{p6}$, with each current source being activated or deactivated via a corresponding switch. In some cases, the currents may be implemented with a binary distribution, such that $I_{p0}=-I$, $I_{p1}=-2I$, . . . , and $I_{p6}=-2^5I$.

In one embodiment, the current sources of the tunable current source 710 may provide currents of equal magnitude and opposite polarity from corresponding current sources of the tunable current source 705. For example, $I_{p6}$ may have equal magnitude and opposite polarity from $I_{n6}$, $I_{p5}$ may have equal magnitude and opposite polarity from Ins, and so forth.

In some cases, $I_n$ shown in FIG. 7 may be provided by $I_n=I_{n0}+I_{n1}+I_{n2}+I_{n3}+I_{n4}+I_{n5}+I_{n6}$, and $I_p$ shown in FIG. 7 may be provided by $I_p=I_{p0}+I_{p1}+I_{p2}+I_{p3}+I_{p4}+I_{p5}+I_{p6}$. In an aspect, a control signal $M_{6:0}=b_6b_5b_4b_3b_2b_1b_0$ from the SAR logic circuit 370 may be utilized to generate individual control signals $m_{n6}, m_{n5}, \ldots,$ and $m_{n0}$ and $m_{p6}, m_{p5}, \ldots,$ and $m_{p0}$ to control the switches. In one case, each bit of the bit sequence from the SAR logic circuit 370 may activate or deactivate a corresponding current source. Although FIGS. 8A and 8B illustrate a number of columns (e.g., number of current sources and corresponding switch) equal to the number of bits in the control signal from the SAR logic circuit 370, the number of columns need not be equal to the number of bits in the control signal.

Figure 9:
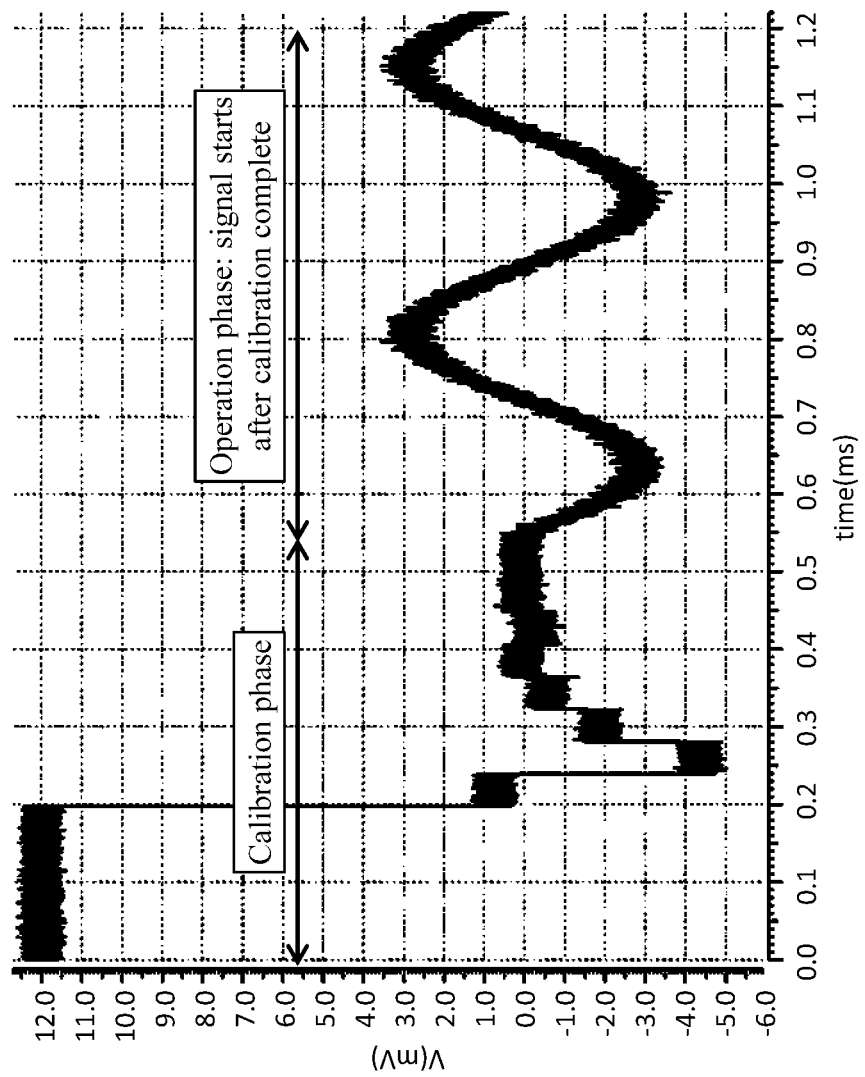
FIG. 9 illustrates an exemplary graph of a difference between differential output voltages of an amplification circuit over time in accordance with one or more embodiments of the present disclosure.

FIG. 9 illustrates an exemplary graph 900 of a difference between output voltages outp and outn of the amplification circuit 315 as a function of time in accordance with one or more embodiments of the present disclosure. This graph 900 is the result of a mixed signal simulation including the effects of thermal and flicker noise in a transient domain. For explanatory purposes, FIG. 9 is described with reference to the system 300, although other systems for facilitating noise, offset, and offset drift mitigation can be utilized in other embodiments.

A calibration phase and an operation phase are identified in the graph 900. During the calibration phase in the illustrated embodiment, no signal input is provided to the amplification circuit 315 (e.g., the signal source 305 is turned off or otherwise considered to provide a zero signal), such that a signal measured at the output of the amplification circuit 315 can more easily be correlated with the offset. As shown in the graph 900, the compensation signals provided by the calibration DAC array 375 to the amplification circuit 315 cause the difference between the output voltages outp and outn to converge towards 0 V to cancel the offset (e.g., the voltage offset 335) associated with the amplification circuit 315. In some cases, the offset may be reduced to less than the specification target, which in audio applications can be a few hundred microvolts. The calibration phase takes (n+1) clock cycles, where n is the bit resolution of the example SAR based calibration circuit. For audio applications, the calibration clock may run at a frequency higher than the audio band. The example shown runs at 25 kHz and for a 7-bit SAR resolution takes around 280 microseconds At the end of the calibration phase, information indicative of the compensation signals to be applied to the amplifier 330 may be stored and used during the operation phase to generate compensation signals to mitigate the offset. During the operation phase, the modulation/demodulation circuits 325 and 340 are clocked by $f_{chop}$, the signal source 305 may be turned on to provide a signal (e.g., an audio signal) to be amplified by the amplification circuit 315 and provided to the load 355.

In one embodiment, the offset calibration circuit 360 may be disconnected from the amplification circuit 315 after the calibration phase (e.g., to allow use of the offset calibration circuit 360 with another amplification circuit). The offset calibration circuit 360 may be reconnected to the amplification circuit 315 for subsequent calibration phases. In another aspect, the offset calibration circuit 360 may remain connected to the amplification circuit 315 during the operation phase and continue to monitor and/or compensate for the offset and associated drift during the operation phase.

FIG. 10A illustrates a graph 1005 of output voltages outp and outn of the amplification circuit 315 without offset mitigation. FIG. 10B illustrates a graph 1010 of output voltages outp and outn of the amplification circuit 315 with offset mitigation. FIGS. 10C and 10D show a zoomed in view of a portion 1015 and 1020 of the graph 1005 and 1010, respectively. As shown in FIG. 10C, the ripple due to the chopped offset 335 appears as a square wave superimposed on the sinusoidal audio wave. In FIG. 10D, the ripple is mitigated. Although FIG. 10C shows the ripple as a square wave superimposed on the audio wave, in other cases the ripple may appear as a triangular wave superimposed on the audio wave.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the scope of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:
1. A system comprising:
an amplification circuit operable to receive an input signal and produce an amplified output signal, the amplification circuit comprising:
a first circuit configured to modulate a received signal to obtain a modulated signal;
a first amplifier configured to amplify the modulated signal to obtain an amplified modulated signal; and
a second circuit configured to demodulate the amplified modulated signal to obtain a demodulated signal, wherein the amplified output signal is based on the demodulated signal; and
an offset calibration circuit comprising:
a logic circuit arranged to selectively receive signal offset information associated with the amplified output signal and adjust a control signal based on the signal offset information during a calibration process; and
a compensation signal generator configured to generate one or more compensation signals based on the adjusted control signal, and apply the one or more compensation signals to the amplification circuit to mitigate offset in the amplified output signal.

2. The system of claim 1, wherein the compensation signal generator is operable to apply the one or more compensation signals at an output of the first amplifier.

3. The system of claim 1, wherein:
the logic circuit is operable to provide information indicative of the control signal associated with a last iteration of the calibration process for storage;
the system further comprises a memory to store the information indicative of the control signal associated the last iteration of the calibration process; and
the amplification circuit further comprises a control circuit configured to generate one or more offset compensation signals based on the information stored in the memory and apply the one or more offset compensation signals on the amplification circuit to compensate for offset in the amplified output signal.

4. The system of claim 1, wherein the amplified output signal of the amplification circuit comprises a set of output signals, the offset calibration circuit further comprising:
a comparator circuit operable to generate a comparator output based on the set of output signals,
wherein the logic circuit is configured to generate the control signal based on the comparator output.

5. The system of claim 4, wherein the set of output signals comprises a pair of differential signals.

6. The system of claim 4, wherein the logic circuit is operable to iteratively adjust the control signal during the calibration process, and wherein in one iteration of the calibration process the logic circuit is operable to:
receive the comparator output in response to providing a first signal as the control signal to the compensation signal generator;
set the control signal to a second signal when the comparator output is of a first polarity; and
set the control signal to a third signal when the comparator output is of a second polarity, wherein the third signal is different from the second signal.

7. The system of claim 1, wherein the logic circuit comprises a successive approximation register logic circuit.

8. The system of claim 1, wherein the compensation signal generator comprises a current generator operable to generate the one or more compensation signals, and wherein each of the one or more compensation signals comprises a current signal.

9. The system of claim 8, wherein the current generator comprises an array of current sources.

10. The system of claim 1, wherein the first circuit and the second circuit are chopper circuits.

11. The system of claim 1, wherein the amplification circuit further comprises a second amplifier serially coupled to the second circuit, and wherein the second amplifier is operable to generate the amplified output signal.

12. A method comprising:
modulating an input signal to obtain a modulated signal;
amplifying, by an amplifier circuit, the modulated signal to obtain an amplified signal;
demodulating the amplified signal to obtain a demodulated signal;
producing an amplified output signal from the demodulated signal;
generating one or more compensation signals based on a control signal to compensate for an offset associated with the amplified output signal;
adjusting the control signal based on the amplified output signal during a calibration process; and
applying the one or more compensation signals to the amplifier circuit to adjust the amplified output signal, thereby suppressing a ripple due to an upmodulated offset.

13. The method of claim 12, further comprising setting the control signal through operation of a successive approximation register (SAR) circuit.

14. The method of claim 13, further comprising:
adjusting, by the SAR circuit, the control signal based on the adjusted amplified output signal;
adjusting, by a compensation signal generator, the one or more compensation signals based on the adjusted control signal; and
applying, by the compensation signal generator, the one or more adjusted compensation signals to the amplifier circuit to further adjust the amplified output signal.

15. The method of claim 14, wherein the adjusted amplified output signal comprises a set of output signals, the method further comprising:
generating a comparator output by comparing the set of output signals, wherein the adjusted control signal is generated based on the comparator output.

16. The method of claim 15, wherein the adjusting the control signal comprises:
receiving the adjusted amplified output signal in response to setting the control signal to a first signal;
setting the control signal to a second signal when the comparator output is of a first polarity; and
setting the control signal to a third signal when the comparator output is of a second polarity, wherein the third signal is different from the second signal.

17. The method of claim 12, wherein the generating one or more compensation signals and the applying the one or more compensation signals form an iterative process comprising, in a last iteration:
adjusting the control signal based on the amplified output signal during the last iteration;
storing information indicative of the adjusted control signal;
generating one or more offset compensation signals based on the stored information; and
applying the one or more offset compensation signals on the amplifier circuit to compensate for offset associated with the amplifier circuit.

18. The method of claim 12, wherein generating one or more compensation signals is performed by a compensation signal generator.

19. The method of claim 12, wherein modulating the input signal comprises applying the input signal to a chopper circuit.

* * * * *